United States Patent
Bryant-Rich et al.

(10) Patent No.: US 9,437,312 B2
(45) Date of Patent: Sep. 6, 2016

(54) MANAGEMENT OF WRITE-PROTECTED DATA IN A SEMICONDUCTOR MEMORY

(75) Inventors: Donald Ray Bryant-Rich, Haifa (IL); Tal Sagy, Even Yehuda (IL)

(73) Assignee: SANDISK IL LTD., Kfar Saba (IL)

(*) Notice: Subject to any disclaimer, the term of this patent is extended or adjusted under 35 U.S.C. 154(b) by 800 days.

(21) Appl. No.: 12/393,599

(22) Filed: Feb. 26, 2009

(65) Prior Publication Data

US 2010/0217917 A1 Aug. 26, 2010

(51) Int. Cl.
*G06F 12/00* (2006.01)
*G06F 13/00* (2006.01)
*G06F 13/28* (2006.01)
*G11C 16/22* (2006.01)
*G11C 7/24* (2006.01)

(52) U.S. Cl.
CPC *G11C 16/22* (2013.01); *G11C 7/24* (2013.01)

(58) Field of Classification Search
CPC .... G06F 12/1416; G06F 12/14; G06F 12/16; G06F 21/10; G06F 3/0619; G11B 20/00702
USPC .................................................. 711/103, 156
See application file for complete search history.

(56) References Cited

U.S. PATENT DOCUMENTS

| | | | |
|---|---|---|---|
| 6,675,276 B2 | 1/2004 | Schulze et al. | |
| 6,731,536 B1* | 5/2004 | McClain et al. | 365/185.04 |
| 7,397,738 B2 | 7/2008 | Hwang et al. | |
| 7,412,558 B2 | 8/2008 | Oribe et al. | |
| 2002/0004878 A1* | 1/2002 | Norman | 711/103 |
| 2002/0016872 A1* | 2/2002 | Anzai et al. | 710/15 |
| 2002/0095545 A1* | 7/2002 | Dalvi et al. | 711/103 |
| 2005/0138314 A1 | 6/2005 | Liang et al. | |
| 2005/0259484 A1* | 11/2005 | Newell | 365/195 |
| 2005/0265212 A1* | 12/2005 | Yoshida et al. | 369/275.1 |
| 2006/0015676 A1* | 1/2006 | Oribe et al. | 711/103 |
| 2008/0170436 A1* | 7/2008 | Chun et al. | 365/185.04 |

(Continued)

FOREIGN PATENT DOCUMENTS

| | | |
|---|---|---|
| CN | 1649032 A | 8/2005 |
| CN | 101303670 A | 11/2008 |

(Continued)

OTHER PUBLICATIONS

"512M×8 Bit / 1G×8 Bit NAND Flash Memory", K9W8G08U1M/K9K4G08U0M, Samsung Electronics Data Sheet, www.datasheetcatalog.com/datasheets_pdf/K/9/W/8/K9W8G08U1M.shtml, Revision 0.7, Feb. 14, 2005, 37 pages.

Office Action issued Jan. 19, 2015 in Taiwanese Application No. 099101237, with English translation, 25 pages.

*Primary Examiner* — Charles Rones
*Assistant Examiner* — Sidney Li
(74) *Attorney, Agent, or Firm* — Toler Law Group, PC (57) ABSTRACT

Systems and methods of finalizing a semiconductor memory are disclosed. A method includes receiving an instruction to finalize data at a data storage device that includes a controller coupled to a semiconductor memory. The data storage device also includes a status indicator to indicate a finalize status of the semiconductor memory. In response to receiving the instruction to finalize the data at the data storage device, the status indicator is set to a finalize value. Write to the semiconductor memory operations are prevented by the controller in response to the status indicator having the finalize value.

38 Claims, 8 Drawing Sheets

(56) References Cited

U.S. PATENT DOCUMENTS

2008/0250509 A1* 10/2008 Ahvenainen .................... 726/34
2009/0161466 A1* 6/2009 Hamilton et al. ............ 365/222

FOREIGN PATENT DOCUMENTS

| EP | 1780715 A1 | 5/2007 |
| TW | 200731228 | 8/2007 |

* cited by examiner

MANAGEMENT OF WRITE-PROTECTED DATA IN A SEMICONDUCTOR MEMORY

FIELD OF THE DISCLOSURE

The present disclosure is generally related to finalizing semiconductor memory.

BACKGROUND

Portable memory devices and storage media may be used in a variety of applications. One application of portable media is to serve as an archive of stored data. For example, some optical media technologies such as Compact Disc-Recordable (CD-R) or Digital Video Disc-Recordable (DVD-R) enable data to be stored to the media, and the media may be finalized using a finalization operation. After finalization, additional data may not be recorded to the disc and data may not be deleted from the disc. As such, the finalized disc may be used for archival purposes.

Non-volatile semiconductor memory devices, such as removable storage cards or universal serial bus (USB) flash memory devices, have enabled increased portability of data and software applications. Non-volatile semiconductor memory devices may operate in one or more operational modes, such as a rewriteable memory that enables data stored at a memory location to be overwritten or erased or a write-once read-many (WORM) memory that does not allow data to be deleted form a memory location after being written.

SUMMARY

Systems and methods of finalizing semiconductor memory are disclosed. A semiconductor memory device, such as a flash memory device or one-time-programmable (OTP) memory device, implements a finalization function to prevent changes to data stored at the memory. When executed, the finalization function may cause a persistent value to be set in the memory indicating a finalized status of the memory. After the persistent value is set to indicate the finalized status, subsequent attempts to write data to the memory or to delete data from the memory are prevented, and the device may permanently indicate its read-only status.

DETAILED DESCRIPTION

Figure 1:
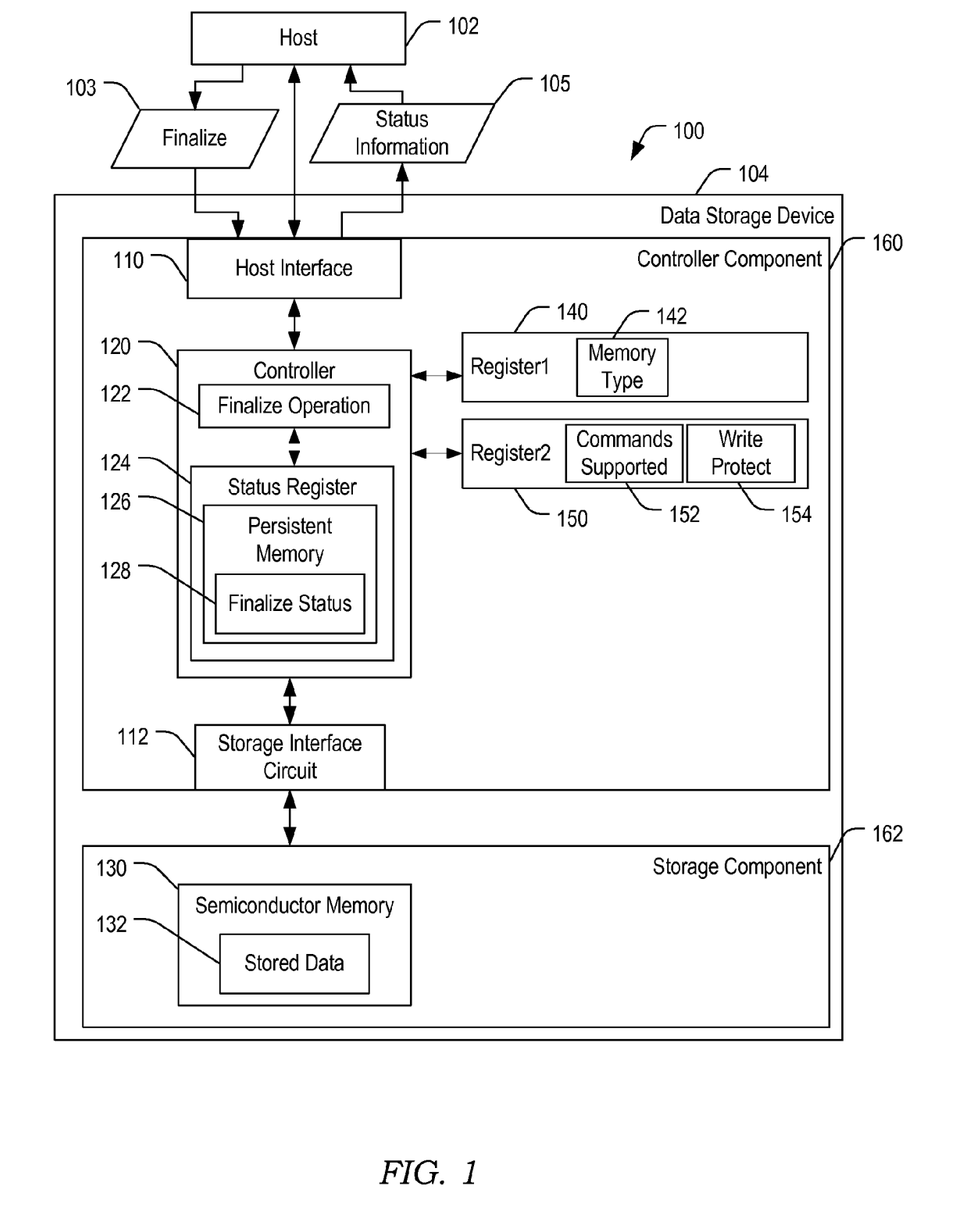
FIG. 1 is a block diagram of a first particular embodiment of a system to finalize a semiconductor memory.

Referring to FIG. 1, a particular illustrative embodiment of a system to finalize a semiconductor memory is depicted and generally designated 100. The system 100 includes a host 102 in communication with a data storage device 104. The data storage device 104 includes a controller 120 formed on a controller component 160 and a semiconductor memory 130 formed on a storage component 162. The data storage device 104 is configured to receive a finalize instruction 103 and in response, to set a status indicator to a finalize value to prevent write operations at the storage semiconductor memory 130.

In a particular embodiment, the host 102 is a computer, such as a personal computer (PC) or notebook computer, a portable wireless device, such as a mobile or cellular telephone or personal digital assistant (PDA), a multimedia device, such as a video player or set-top box device, or any other type of device that may communicate with the data storage device 104. In an illustrative embodiment, the data storage device 104 is removable from the host 102, such as a flash drive or removable memory card. In another illustrative embodiment, the data storage device 104 is implemented within the host 102, such as an internal memory of a digital music player.

In a particular embodiment, the controller component 160 includes a host interface 110, the controller 120 coupled to the host interface 110, and a storage interface circuit 112 coupled to the controller 120. The host interface 110 enables communication with the host 102, such as by using a Universal Serial Bus (USB) or Compact Flash (CF) protocol, as illustrative, non-limiting examples. The storage interface circuit 112 enables communication with the storage component 162, such as via a parallel bus. The controller component 160 may also include a first register 140 storing a memory type indicator 142. The controller component 160 may also include a second register 150 that includes a commands supported indicator 152 and a write protect status indicator 154.

In a particular embodiment, the controller 120 is configured to perform a finalize operation 122 in response to receiving the finalize instruction 103. The finalize operation 122 may cause the controller 120 to set a status indicator 128 to a finalize value. In a particular embodiment an "indicator" may be a data value stored at a predetermined memory address or field that represents a state or condition. For example, the status indicator 128 includes a value stored at a specified memory location that indicates to the controller 120 whether the semiconductor memory 130 has been finalized. The status indicator 128 may be stored at a persistent memory 126 of a status register 124. Setting the status indicator 128 may be performed by programming one or more persistent memory cells of the persistent memory 126 to a logical value that is persistently retained, such as a logical one value. The status register 124 may be integrated within or accessible to the controller 120. By storing a finalize value at the status indicator 128 using the persistent memory 126, after the status indicator 128 is set to the finalize value, the status indicator 128 cannot be returned to a non-finalize value. Examples of persistent memory cells include a write-once or one-time-programmable (OTP) memory cell or a re-writable memory cell such as a flash cell that is controlled to prevent clearing of the stored finalize value.

In a particular embodiment, in response to the data storage device 104 receiving a request to write data to or erase data from the semiconductor memory 130 of the storage component 162, the controller 120 may be configured to determine a value of the status indicator 128. When the status indicator 128 has the finalize value, the controller 120 may be configured to disable access to write data to the semiconductor memory 130, preventing write or erase operations to be performed at the semiconductor memory 130. As a result, data that may be stored at the semiconductor memory 130, such as stored data 132, may be persistently stored at the storage component 162 and the data 132 is unalterable via instructions that are provided by the host 102 to the data storage device 104.

During operation, the host 102 may provide data read and write instructions to the data storage device 104. For example, the host 102 may provide write instructions to cause the controller component 160 to write the stored data 132 to the semiconductor memory 130. The host 102 may subsequently issue the finalize instruction 103.

In response to receiving the finalize instruction 103, the controller 120 may set the status indicator 128 to a finalize value. The controller 120 may further set at least one value of a register that is accessible to the host 102, such as by adjusting the memory type indicator 142 from a re-writeable value, write-once read-many (WORM) value, or one-time-programmable (OTP) value, to a read-only memory (ROM) type value. In addition, the controller 120 may be configured to adjust the commands supported indicator 152 to indicate that data write operations to the semiconductor memory 130 are not supported. The controller 120 may further be configured to adjust a value of the write protect indicator 154 to indicate that the semiconductor memory 130 is write-protected. The controller 120 may set one or more internal settings (not shown) indicating that data write or erase commands received from the host 102 are to be blocked, prevented, or otherwise not given effect at the semiconductor memory 130.

After receiving the finalize instruction 103, the controller 120 may provide status information 105 to the host 102. The status indicator 105 may include an indication that the memory type of the semiconductor memory 130 is a read-only memory type, that the semiconductor memory 130 does not support data write operations, that the semiconductor memory 130 is write-protected, or any combination thereof. For example, the controller 120 may cause the host 102 to disconnect from the data storage device 104 and to reconnect so that the host 102 will read updated values of the first register 140 and the second register 150, such as the indicators 142, 152, and 154, upon re-connection to the data storage device 104.

Although the controller component 160 is illustrated as including the first register 140 and the second register 150, in other embodiments the memory type indicator 142, the command supported indicator 152, the write-protect indicator 154, or any combination thereof, may not be included in registers of the controller component 160, and instead one or more such indicators may be stored at other locations or calculated as needed, such as upon determining a value of the status indicator 128, or in response to a query from the host 102, as illustrative, non-limiting examples.

The data storage device 104 may therefore be used as an archival media device by enabling data write and data erase operations prior to receiving the finalize instruction 103 and preventing data write and data erase operations after receiving the finalize instruction 103. Because the status indicator 128 persistently stores the finalize value, the data storage device 104 remains in the finalize state after the finalize operation is executed. Data stored at the semiconductor memory 130, such as the stored data 132, may be reliably archived at the semiconductor memory 130 and a state of the semiconductor memory 130 may not be further altered.

Figure 2:
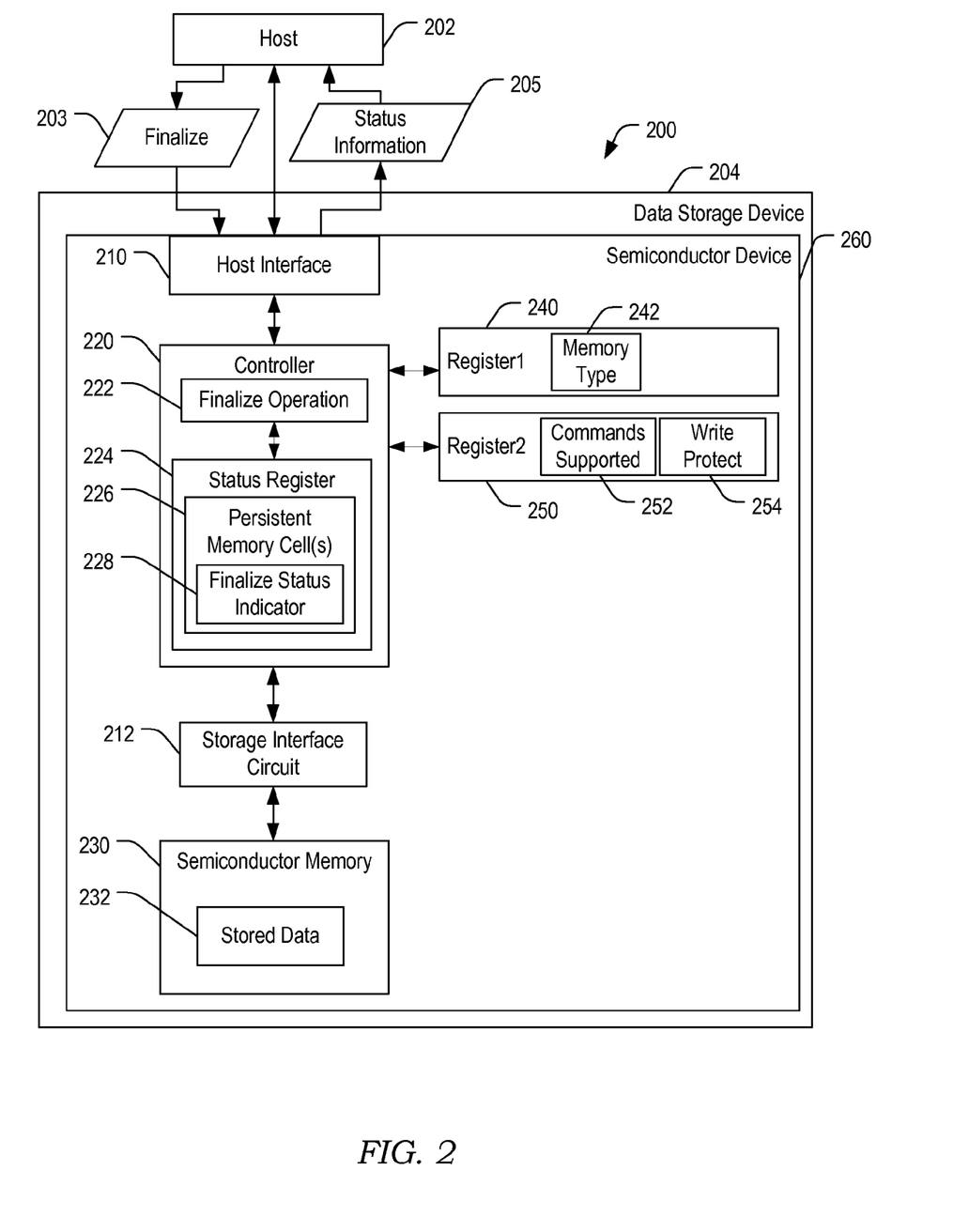
FIG. 2 is a block diagram of a second particular embodiment of a system to finalize a semiconductor memory.

Referring to FIG. 2, a second particular embodiment of a system to finalize a semiconductor memory is depicted and generally designated 200. The system 200 includes a host 202 in communication with a data storage device 204. The data storage device 204 includes a host interface 210, a controller 220, a storage interface circuit 212, and a semiconductor memory 230. The controller 220 and the semiconductor memory 230 are integrated into a single semiconductor device 260.

The controller 220 is configured to implement a finalize operation 222 in response to receiving a finalize instruction 203 from the host 202. The controller 220 further includes a status register 224 that includes one or more persistent memory cells 226 to persistently store at least a portion of a value of a status indicator 228. For example, the status register 224 may include multiple bits indicating various status attributes of the data storage device 204. At least one bit of the status register 224 may correspond to the status indicator 228, such as a particular bit that has a logical zero value to indicate a non-finalize status and a logical one value to indicate a finalize status. Although one or more bits of the status register 224 that correspond to the finalize status may be stored as logical values at the persistent memory cells 226, other bits of the status indicator 228 or other indicators may not be persistent. Such non-persistent bits may be stored at rewritable memory cells (not shown) of the status register 224 that do not persistently store programmed values.

The controller 220 is coupled to a first register 240 and to a second register 250. The first register 240 may include a memory type indicator 242. The second register 250 may include a commands supported indicator 252 and a write protect indicator 254. In other embodiments, the memory type indicator 242, the commands supported indicator 252, the write protect indicator 254, or any combination thereof, may not be stored at registers 240 and 250 and instead be as stored at the semiconductor memory 230, at the controller 220, or calculated on an as-needed basis.

During operation, the host 202 may send instructions to perform data read and write operations at the semiconductor memory 230. For example, the host 202 may send an instruction to write data, such to write stored data 232 to the semiconductor memory 230. The host 202 may send the finalize instruction 203 to the data storage device 204. In response to the finalize instruction 203, the controller 220 may set the status indicator 228 to a finalize value. The finalize value may include setting one or more of the persistent memory cells 226 to a high value, from which the persistent memory cells 226 cannot be returned to a logical low value by the controller 220. For example, the persistent memory cells 226 may include one-time-programmable memory that may use one or more fuses or anti-fuses to store a data value or may include re-writable cells, such as flash memory cells that are controlled to prevent changing a stored finalize value to a non-finalize value.

In response to receiving the finalize instruction 203, the controller 220 may also update values of the memory type indicator 242, the commands supported indicator 252, the write protect indicator 254, or any combination thereof, to indicate that the semiconductor memory 230 has been finalized and that further data writes, erases, or other attempts to alter data at the semiconductor memory 230 will be prevented. For example, the controller 220 may be configured to indicate to the host 202 that the semiconductor memory 230 has a read-only memory type, does not support write commands, and is write-protected, such as via a status information message 205. The data storage device 204 may therefore function as an archival media device that is capable of preserving a state of the semiconductor memory 230 and stored data 232 in response to receiving the finalize instruction 203.

Figure 3:
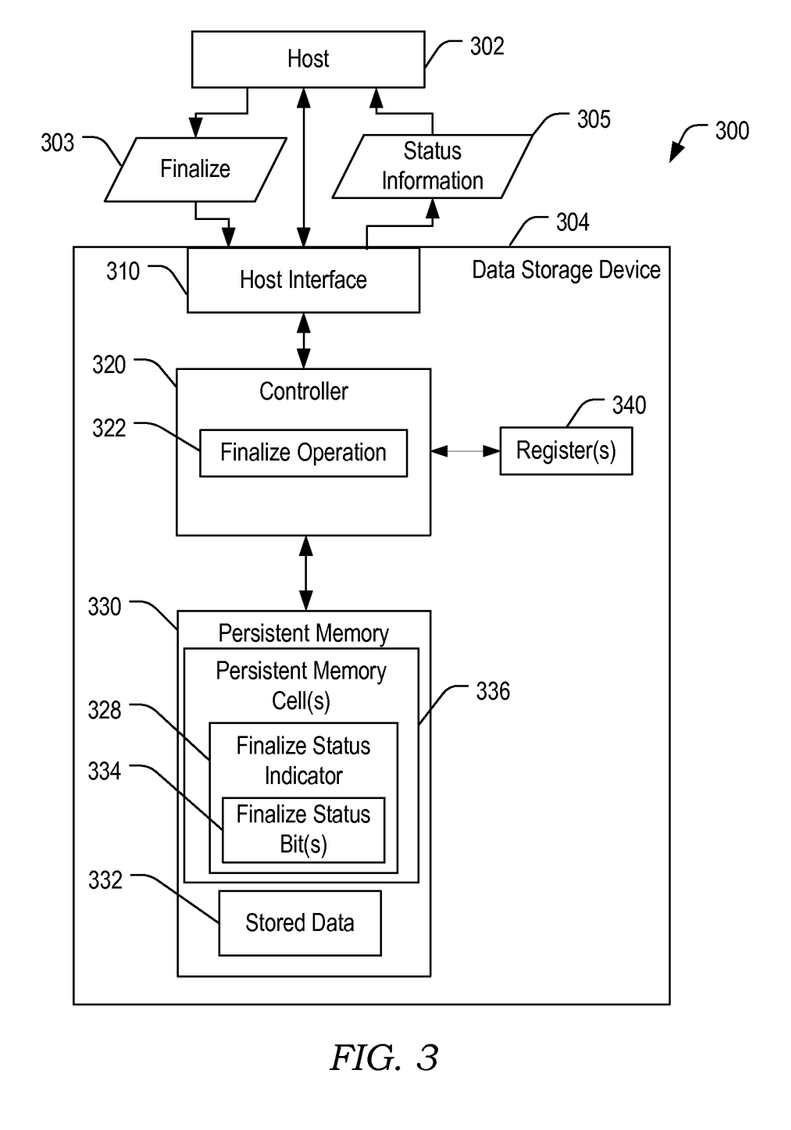
FIG. 3 is a block diagram of a third particular embodiment of a system to finalize a semiconductor memory.

Referring to FIG. 3, a third particular embodiment of a system to finalize a semiconductor memory is depicted and generally designated 300. The system 300 includes a host 302 in communication with a data storage device 304. The data storage device 304 includes a host interface 310, a controller 320, one or more registers 340, and a persistent memory 330.

In a particular embodiment, the persistent memory 330 is configured to enable data to be written, but the persistent memory 330 does not enable data to be erased or overwritten. For example, the persistent memory 330 may include a one-time-programmable memory such that once a logical one value is written to a memory cell, the memory cell may not be returned a logical zero state. One such example may include a fused or anti-fused memory cell. As another example, the persistent memory 330 may include a write-once read-many (WORM) memory. The WORM memory may appear to be re-writable to the host 302; however, individual memory cells may not be re-writable. Instead, updates to data files may be stored as additional files at the memory and corresponding file system data may be rewritten or updated until all available storage space is consumed at the persistent memory 330. As yet another example, the persistent memory 330 may be a flash memory where data re-writes and data erases are prevented by the controller 320.

The persistent memory 330 includes a particular set of persistent memory cells 336. The set of persistent memory cells 336 includes a finalize status indicator 328 that may include one or more finalize status bits 334. The persistent memory 330 may also include stored data 332.

During operation, the controller 320 is responsive to receiving a finalize instruction 303 by executing a finalize operation 322. Executing the finalize operation 322 may include setting a finalize value at the one or more finalize status bits 334 of the status indicator 328 at the set of persistent memory cells 336. In addition, the controller 320 may update one or more values of status information, such as commands supported, memory type information, write protection status, or any combination thereof, and may return such information as status information 305 to the host 302.

Figure 4:
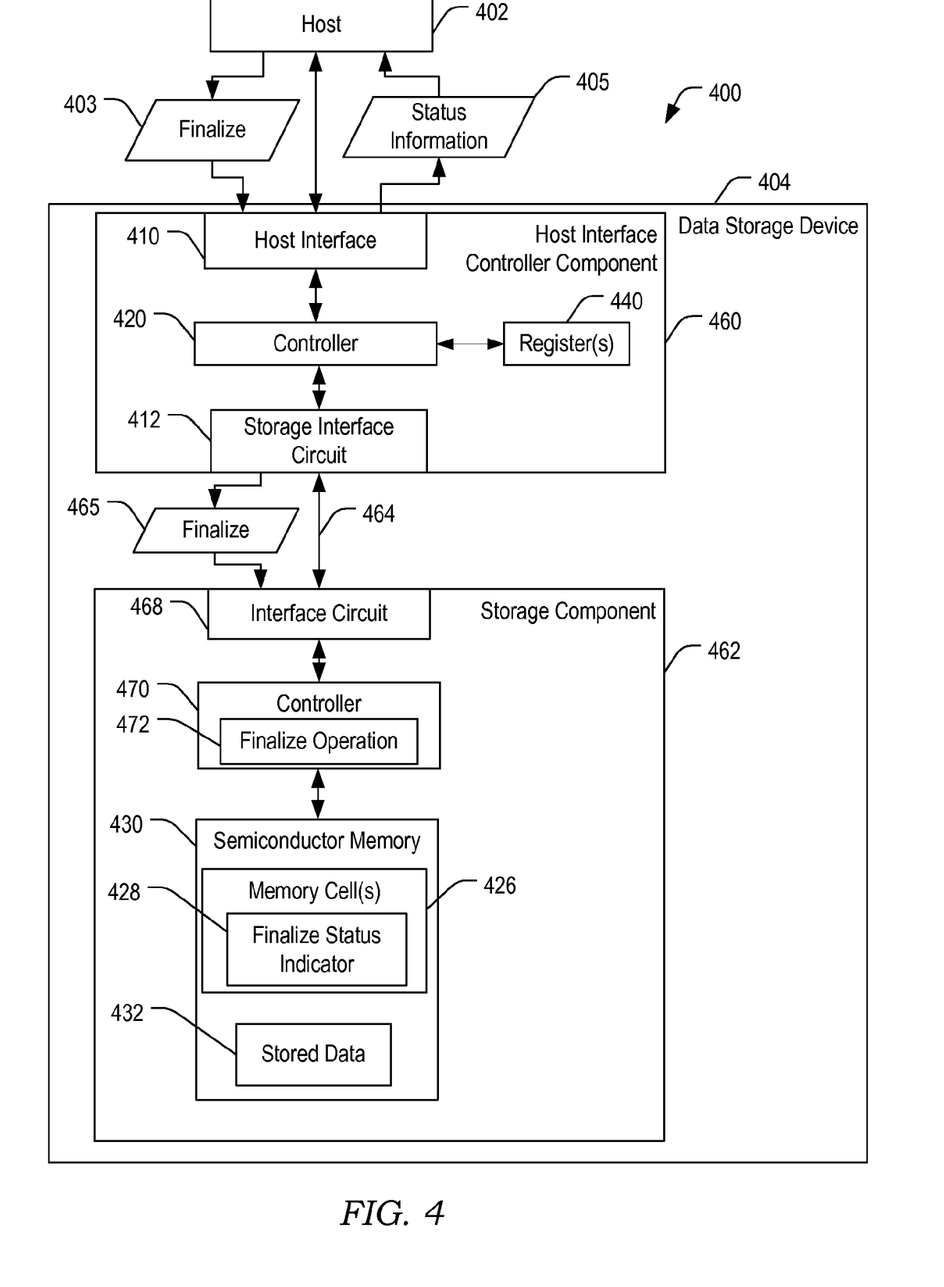
FIG. 4 is a block diagram of a fourth particular embodiment of a system to finalize a semiconductor memory.

Referring to FIG. 4, a fourth particular embodiment of a system to finalize a semiconductor memory is depicted and generally designated 400. The system 400 includes a host 402 in communication with a data storage device 404. The data storage device 404 includes a host interface controller component 460 coupled to a storage component 462 via a bus 464.

In a particular embodiment, the host interface controller component 460 includes a host interface 410 that is configured to receive instructions and data from the host 402 and to provide data and other information to the host 402. The host interface controller component 460 also includes a controller 420 coupled to the host interface 410 and further coupled to a storage interface circuit 412. The controller 420 may also be coupled to one or more registers 440.

In a particular embodiment, the storage interface circuit 412 includes multiple electrical connectors that are coupled to the bus 464. For example, the bus 464 may include an 8-bit, 16-bit, or other size bus configured to provide data and instructions, such as finalize instruction 465, to the storage component 462. The bus 464 may further be configured to return data and other information, such as an acknowledgment indicator (not shown), from the storage component 462 to the storage interface circuit 412.

In a particular embodiment, the storage component 462 includes a semiconductor memory 430 and an interface circuit 468 that is coupled to the bus 464. The interface circuit 468 is configured to receive instructions and data via the bus 464 and to return status information and other data by driving electrical signals at the bus 464. The storage component 462 also includes a controller 470 that is coupled to the interface circuit 468 and that is also coupled to the semiconductor memory 430.

The controller 470 may be configured to perform a finalize operation 472 in response to receiving the finalize instruction 465 from the host interface controller component 460. For example, the controller 470, which in a particular embodiment may be implemented using combinatorial logic circuitry, may execute the finalize operation 472 to finalize the semiconductor memory 430, such as by setting a finalize status indicator 428 stored at one or more memory cells 426 of the semiconductor memory 430. By setting the finalize status indicator 428 to a finalize value, data that is stored at the semiconductor memory 430, such as stored data 432, may be persistently held at the semiconductor memory 430, and additional data may be prevented from being written to the semiconductor memory 430.

To illustrate, when the controller 470 receives a data write or data read request to access the semiconductor memory 430, the controller 470 may query the finalize status indicator 428. In response to determining that the finalize status indicator 428 has a finalize value, the controller 470 may return a negative acknowledgment or failure indicator to the host interface controller component 460 via the bus 464. In this manner, the storage component 462, which may be representative of one or more storage components within the data storage device 404, may be finalized individually, and such finalization may be enforced within the storage component 462, rather than by the host interface controller component 460.

Figure 5:
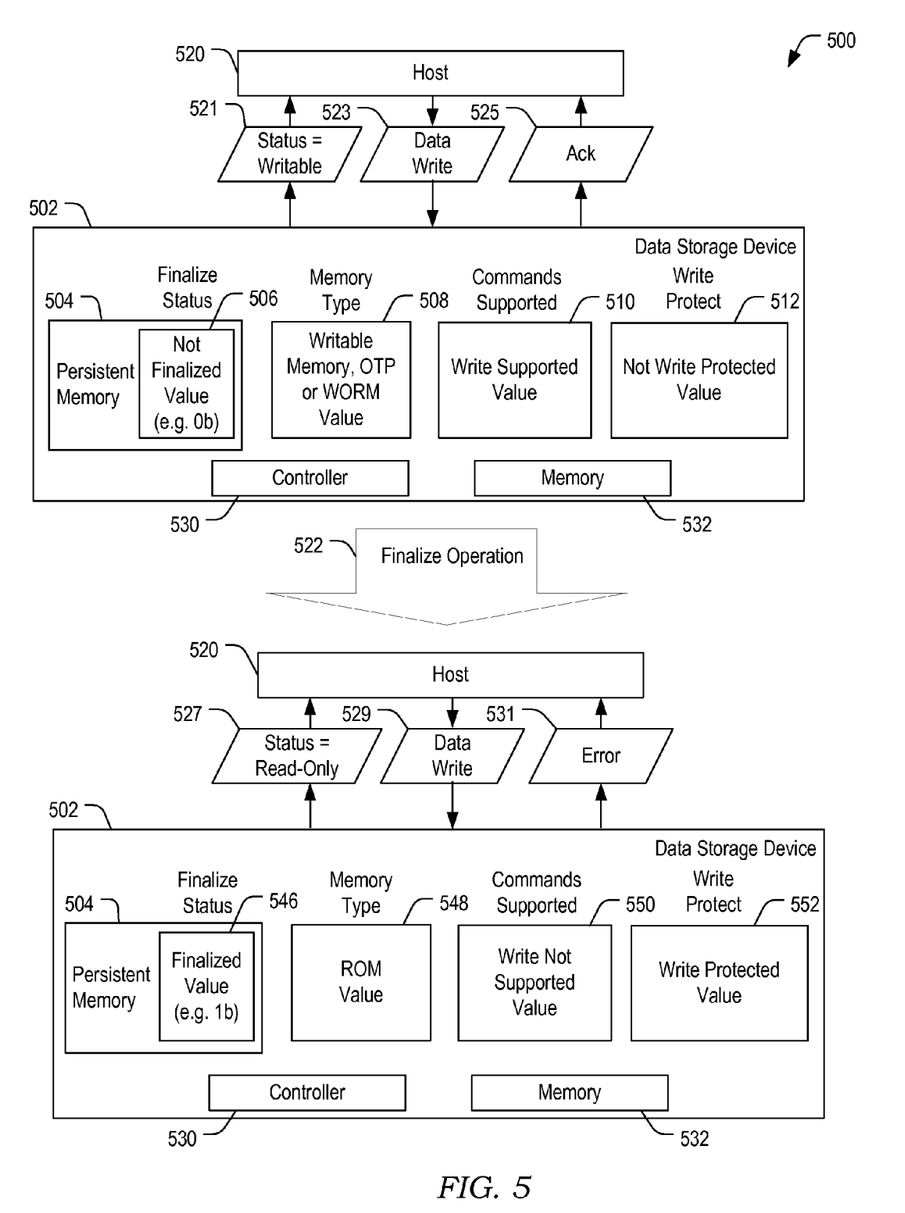
FIG. 5 is a general diagram illustrating a particular embodiment of operation of a system to finalize a semiconductor memory before and after a finalize instruction.

Referring to FIG. 5, a general illustration of a particular embodiment of a system to implement a finalize instruction at a semiconductor memory is depicted and generally designated 500. A data storage device 502 is depicted in communication with a host 520. The data storage device includes a controller 530 and a memory 532. In a particular embodiment, the data storage device 502 is the data storage device 104 of FIG. 1, the data storage device 204 of FIG. 2, the data storage device 304 of FIG. 3, the data storage device 404 of FIG. 4, or any combination thereof.

The data storage device 502 includes a persistent memory 504 having at least one finalize status indicator storing a not-finalized value 506. For example, the not-finalized value 506 may be a binary zero value. The data storage device 502 also includes a memory type indicator storing a value 508 that includes a writeable memory, a one-time-programmable (OTP) value, a write-once ready-many (WORM) value 508, or any combination thereof. The data storage device 502 includes a commands supported indicator storing a write supported value 510. The write supported value 510 indicates that the data storage device 502 supports write commands directed to write data to the memory 532. The data storage device 502 also includes a write protect indicator having a not-write-protected value 512.

As illustrated, the data storage device 502 may provide a status indicator 521 to the host 520 indicating that the memory 532 has a writeable status. The host 520, in response to the status indicator 521 indicating the writeable status, may provide a data write command 523 to the data storage device 502 to write data to the memory 532. In response to the data write command 523, the data storage device 502 may write data to the memory 532 and send an acknowledgment 525 to the host 520.

After processing a finalize operation, schematically illustrated as an arrow 522, the data storage device 502 is illustrated as storing a finalized value 546 at the persistent memory 504 storing the finalize status indicator. For example, the finalize value 546 may be a binary one value indicating that the memory 532 has a finalized status. The memory type may store a read-only memory (ROM) value 548 indicating that the memory 532 may be read but is not writeable. The commands supported indicator may include a write-not-supported value 550 indicating that write commands are not supported at the memory 532. The write protect indicator may store a write protected value 552, indicating that the memory 532 is write-protected.

After the finalize operation 522, the data storage device 502 prevents further data writes to the memory 532. In addition, the data storage device 502 includes one or more indicator values that may be provided to a host device to indicate to the host device that additional data writes are not permitted at the memory 532. For example, the data storage device 502 may provide a status indication message 527 to the host 520 indicating that the status of the memory 532 is read-only. The host 520 may send a data write instruction 529 to the data storage device 502 after finalization, in response to which the data storage device 502 may send an error message 531.

Figure 6:
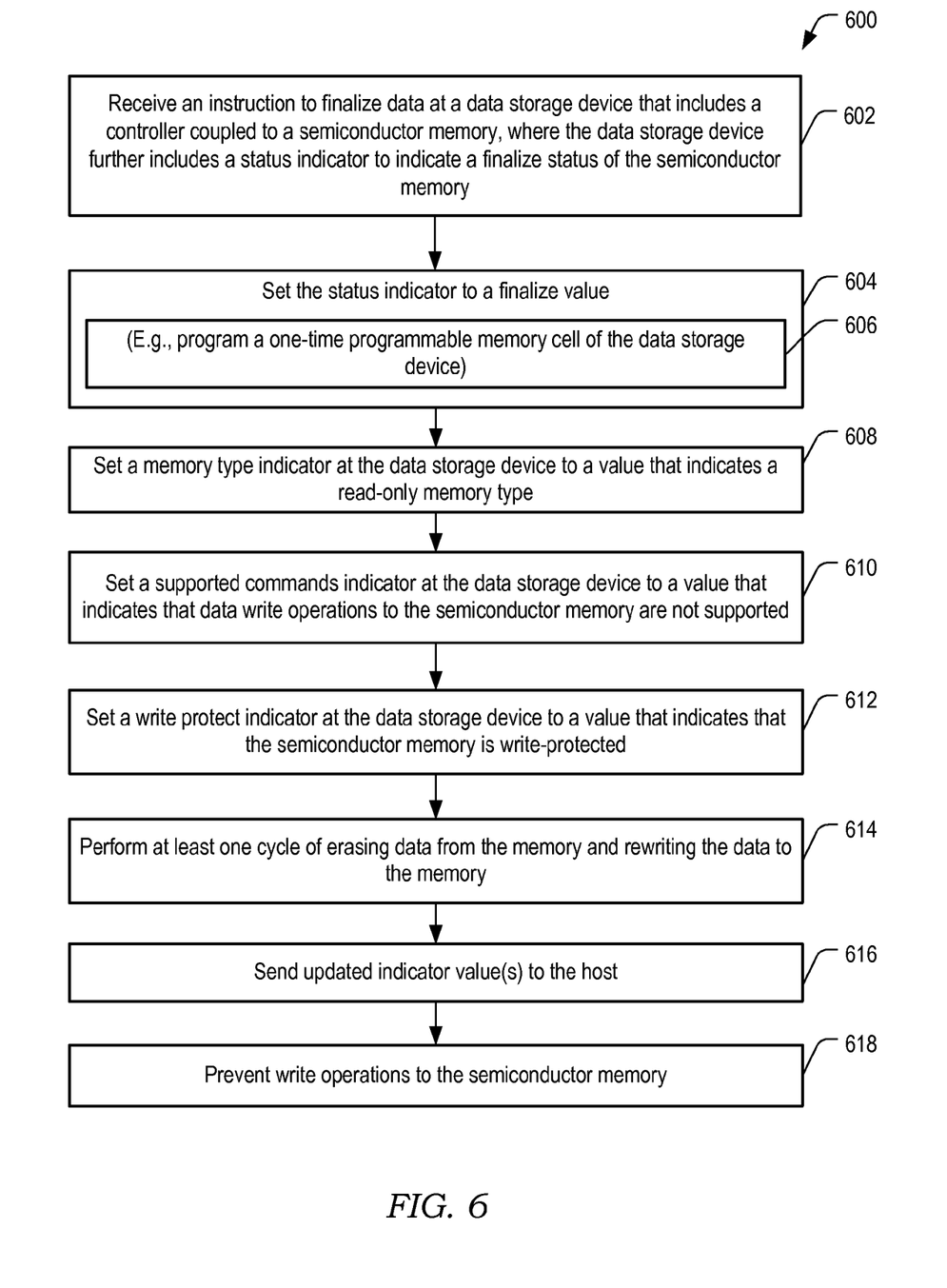
FIG. 6 is a flow diagram of a particular embodiment of a method of finalizing a semiconductor memory.

Referring to FIG. 6, a flow chart of particular embodiment of a method of finalizing a semiconductor memory is depicted and generally designated 600. In an illustrative embodiment, the method 600 may be performed by the data storage device 104 of FIG. 1, the data storage device 204 of FIG. 2, the data storage device 304 of FIG. 3, the data storage device 404 of FIG. 4, the data storage device 502 of FIG. 5, or any combination thereof.

An instruction to finalize data is received at a data storage device that includes a controller coupled to a semiconductor memory, at 602. The data storage device further includes a status indicator to indicate a finalize status of the semiconductor memory. For example, the status indicator may be at the controller, such as the status indicator 128 of FIG. 1, or at the semiconductor memory, such as the status indicator 328 of FIG. 3.

In response to receiving the instruction to finalize the data at the data storage device, the status indicator is set to a finalize value, at 604. The controller is configured to prevent write operations to the semiconductor memory in response to the status indicator having the finalize value. The controller may also be configured to prevent erase operations to the semiconductor memory in response to the status indicator having the finalize value. Thus, in response to setting the status indicator to the finalize value, the semiconductor memory may be preserved in a finalized state and may be used as archived media storage.

In a particular embodiment, setting the status indicator to the finalize value includes programming a persistent memory cell of the data storage device, at 606. The persistent memory cell may be, as non-limiting examples, a one-time programmable memory cell that stores at least a portion of the status indicator as a logical value, a rewritable memory cell to which subsequent writes are prevented by the controller, or another type of memory cell that is configured to store a value in spite of subsequent instructions to erase or to overwrite the value. In a particular embodiment, the persistent memory cell is located at the controller, such as the persistent memory cells 126 of FIG. 1. In another embodiment, the persistent memory cell is located at the semiconductor memory, such as the persistent memory cells 336 of FIG. 3.

In a particular embodiment, the controller and the semiconductor memory are integrated in a single semiconductor device. For example, the controller and the semiconductor memory may be the controller 220 and the semiconductor memory 230 integrated in the semiconductor device 260 of FIG. 2. In another embodiment, the controller is formed on a controller component and the semiconductor memory is formed on a storage component. For example, the controller component may be the controller component 160 and the storage component may be the storage component 162 of FIG. 1.

In a particular embodiment, in response to receiving the instruction to finalize the data at the semiconductor memory, a memory type indicator at the data storage device is set to a value that indicates a read-only memory type, at 608. For example, the memory type indicator may be the memory type indicator 142 of FIG. 1, the memory type indicator 242 of FIG. 2, or the memory type indicator shown in FIG. 5 having the read-only memory (ROM) value 548, as illustrative, non-limiting examples. A value of the memory type indicator may be provided to a host device to indicate to the host device that the semiconductor memory is a read-only memory type, such as via status information sent to the host upon connection or re-connection with the host.

In a particular embodiment, in response to receiving the instruction to finalize the data at the semiconductor memory, a supported commands indicator at the data storage device is set to a value that indicates that data write operations to the semiconductor memory are not supported, at 610. For example, the supported commands indicator may be the commands supported indicator 152 of FIG. 1, the commands supported indicator 252 of FIG. 2, or the commands supported indicator shown in FIG. 5 having the write not supported value 550, as illustrative, non-limiting examples. A value of the commands supported indicator may be provided to a host device to indicate to the host device that the data storage device does not support write operations at the semiconductor memory, such as via status information sent to the host upon connection or re-connection with the host.

In a particular embodiment, in response to receiving the instruction to finalize the data at the semiconductor memory, a write protect indicator at the data storage device is set to a value that indicates that the semiconductor memory is write-protected, at 612. For example, the write protect indicator may be the write protect indicator 154 of FIG. 1, the write protect indicator 254 of FIG. 2, or the write protect indicator shown in FIG. 5 having the write protected value 552, as illustrative, non-limiting examples. A value of the write protect indicator may be provided to a host device to indicate to the host device that the semiconductor memory is write protected, such as via status information sent to the host upon connection or re-connection with the host.

In another embodiment, in response to receiving a query from a host device, a value of the status indicator is read and at least one of a value that indicates a memory type, a value that indicates whether data write operations are supported, or a value that indicates whether the semiconductor memory is write-protected is generated based on the value that is read from the status indicator. As a result, one or more such values may be determined on an "as-needed" basis based on the status indicator, rather than being set directly in response to receiving the instruction to finalize the data at the semiconductor memory.

Optionally, in a particular embodiment where the semiconductor memory includes a flash memory, as part of a finalization operation, at least one cycle of erasing data from the flash memory and rewriting the data to the flash memory is performed, at 614. For example, the semiconductor memory may be a flash memory that exhibits improved data retention at a memory cell after several write operations have been performed at the memory cell. As an illustrative, non-limiting example, the first data value ever stored at the memory cell may statistically not be retained as long as a data value that results from a third data write operation to the memory cell. The data storage device may be configured to track a number of data writes to memory cells and, if the number of data writes results in a predicted data retention that is expected to be improved by performing one or more additional cycles of erasing and rewriting the data to the memory cells, one or more additional cycles of erasing and rewriting the data may be performed. In another embodiment, it may be advantageous to write data having correctable errors to the flash memory without correcting the errors to improve write performance during normal operation. Before finalizing the memory, such errors in the stored data may be corrected concurrently with performing the one or more additional cycles of erasing and programming the data.

In a particular embodiment, one or more updated indicator values are sent to the host, at 616. For example, the memory type indicator value, the supported commands value, the write protect value, one or more other values, or any combination thereof, may be sent to the host to indicate a result of the finalize operation. In some cases, the host may read one or more registers of the data storage device upon connection to the device, and the data storage device may cause the host to disconnect and to re-connect to the data storage device so that the host reads updated indicator values that may be stored at the one or more registers.

After initiating the finalize operation, write to the semiconductor memory operations may be prevented, at 618. For example, indicators sent to the host may prevent the host from attempting to perform data erase or data write operations at the semiconductor memory. In addition, or alternatively, the controller or other mechanism internal to the data storage device may prevent erase from the semiconductor memory operations or write to the semiconductor memory operations from being executed or from having effect at the semiconductor memory.

Although the method 600 is illustrated and described as having a particular order, in other embodiments operations following receiving the instruction to finalize data, at 602, may be performed in any other order. In addition, one or more operations may be performed substantially simultaneously or at least partially in parallel with each other. Also, although the method 600 is illustrated in a particular embodiment that includes several operations, in other embodiments the method may not include one or more illustrated operations or may include additional operations.

Figure 7:
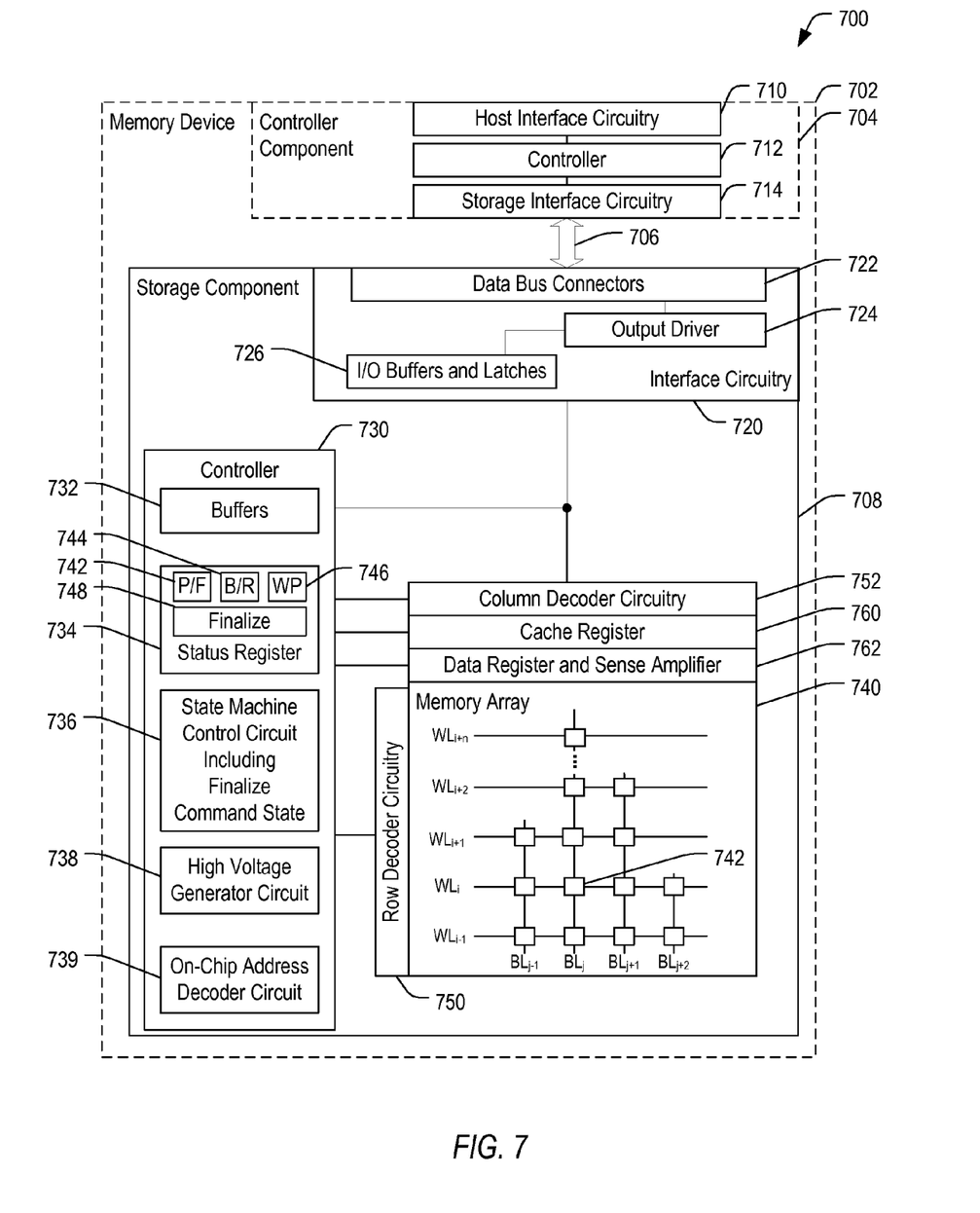
FIG. 7 is a block diagram of a first illustrative system that can be used to finalize a semiconductor memory.

Referring to FIG. 7, an illustrative embodiment of a system that can be used to finalize a semiconductor memory is depicted and generally designated 700. The system 700 includes a memory device 702 that includes a controller component 704 coupled to a storage component 708.

In a particular embodiment, the memory device 702 may be the data storage device 104 of FIG. 1, the data storage device 204 of FIG. 2, the data storage device 304 of FIG. 3, the data storage device 404 of FIG. 4, the data storage device 502 of FIG. 5, or any combination thereof. The controller component 704 may include host interface circuitry 710, a controller 712, and storage interface circuitry 714. The controller component 704 may be coupled to the storage component 708 via a bus 706, such as an 8-bit or 16-bit parallel data bus, as an illustrative, non-limiting example. The controller component 704 may communicate instructions and data with an external host (not shown) via the host interface circuitry 710. The controller 712 may be configured to respond to instructions received by the host interface circuitry 710 and may also be configured to send and receive data and instructions to the storage component 708 via the storage interface circuitry 714.

In a particular embodiment, the storage component 708 includes interface circuitry 720, a controller 730 coupled to the interface circuitry 720, and a memory array 740 accessible to the controller 730. The storage component 708 may include row decoder circuitry 750 and column decoder circuitry 752 that enable access to data stored at one or more particular rows and particular columns of the memory array 740, such as to read a value from or to write a value to a particular memory cell 742 at a bit line BLj and at word line WLi. A cache register 760 and a data register and sense amplifier 762 may further be coupled to the memory array 740 and may be used to cache or to temporarily store data that is to be written to the memory array 740 or data that has been read out of the memory array 740. In a particular embodiment, the memory array 740 may include a flash memory. In a particular embodiment, it may be advantageous to write data having correctable errors to the flash memory without correcting the errors to improve write performance during normal operation. Before finalizing the memory, such errors in the stored data may be corrected concurrently with performing the one or more additional cycles of erasing and programming the data.

In a particular embodiment, the controller 730 includes one or more buffers 732 to store instructions, data, or any combination thereof The controller 730 may also include one or more status registers 734, a state machine control circuit 736 including a finalize command state, a high voltage generator circuit 738, and an on-chip address decoder circuit 739. The controller 730 may be coupled to provide electrical signals to the row decoder circuitry 750, to the column decoder circuitry 752, to the cache register 760, and to the data register and sense amplifier 762. In a particular embodiment, the controller 730, including one or more of the buffers 732, the status register 734, the state machine control circuit 736, the high-voltage generation circuit 738, and the on-chip address decoder circuit 739, in conjunction with the interface circuitry 720 and the memory array 740, may be configured to perform at least a portion of the method 600 of FIG. 6.

In a particular embodiment, the status register 734 of the controller 730 may include one or more indicators storing values, such as a Pass/Fail (P/F) value 742, a Busy/Ready (B/R) value 744, a write protect (WP) value 746, and a value of a finalize indicator 748. For example, the finalize indicator 748 may be the finalize status indicator 328 of FIG. 3 or the finalize status indicator 428 of FIG. 4 as illustrative, non-limiting examples. The status register 734 may be accessible to the state machine control circuit 736 that includes the finalize command state.

The state machine control circuit 736 may include dedicated hardware and circuitry to control an operation of the controller 730 in response to one or more received instructions and internal states, such as may be represented at the status register 734. The state machine control circuit 736 may include states such as a read status state, a data write state, a data read state, as illustrative, non-limiting examples, in addition to the finalize command state. For example, when the state machine control circuit 736 receives a finalize command, such as via the bus 706, the state machine control circuit 736 may transition to the finalize command state, which may result in setting the finalize indicator 748 to a finalize value and in setting one or more values at other indicators of the status register 734. For example, in a particular embodiment where the storage component has a dedicated write protect pin (not shown), the controller 730 may persistently emulate the write protect pin being asserted after receiving the finalize command.

In a particular embodiment, the high voltage generator circuit 738 may be responsive to the state machine control circuit 736 and may be configured to generate a high voltage to program values to, or erase values from, the memory array 740. For example, the memory array 740 may be a flash memory or other memory that may be programmable or erasable via a "high" voltage, such as, for example, five volts (V). The controller 730 may also include the on-chip address decoder circuit 739 that may include hardware and logic circuitry to receive memory address information from the controller component 704 and to decode the memory address information to specific rows and columns to be provided to the row decoder circuitry 750 and the column decoder circuitry 752.

The interface circuitry 720 may include data bus connectors 722, an output driver 724 coupled to the data bus connectors 722, and input/output (I/O) buffers and latches 726. The I/O buffers and latches 726 may be configured to store or to latch data that is received via the data bus connectors 722 or data that is to be written to the data bus 706 via the data bus connectors 722. The data bus connector 722 may include physical electrical connectors that couple the interface circuitry 720 to the data bus 706. The output driver 724 may include dedicated circuitry and electrical connections to enable the interface circuitry 720 to drive electrical signals over the bus 706. In a particular embodiment, the interface circuitry 720 is configured to comply with one or more bus communications protocols or standards Referring to FIG. 8, an illustrative embodiment of a system that can be used to finalize a semiconductor memory is depicted and generally designated 800. The system 800 includes a memory device 802 that includes a controller component 804 coupled to one or more storage components, such as a representative storage component 808, via a bus 806. The representative storage component 808 includes interface circuitry 890 to communicate via the bus 806. The storage component 808 also includes a controller 892 that is coupled to the interface circuitry 890 and that is also coupled to a memory, such as a memory array 894. The memory array 894 may include one or more types of storage media such as a flash memory, a one-time programmable memory, other memory, or any combination thereof. In a particular embodiment, the memory device 802 may be the data storage device 104 of FIG. 1, the data storage device 204 of FIG. 2, the data storage device 304 of FIG. 3, the data storage device 404 of FIG. 4, the data storage device 502 of FIG. 5, or any combination thereof.

Figure 8:
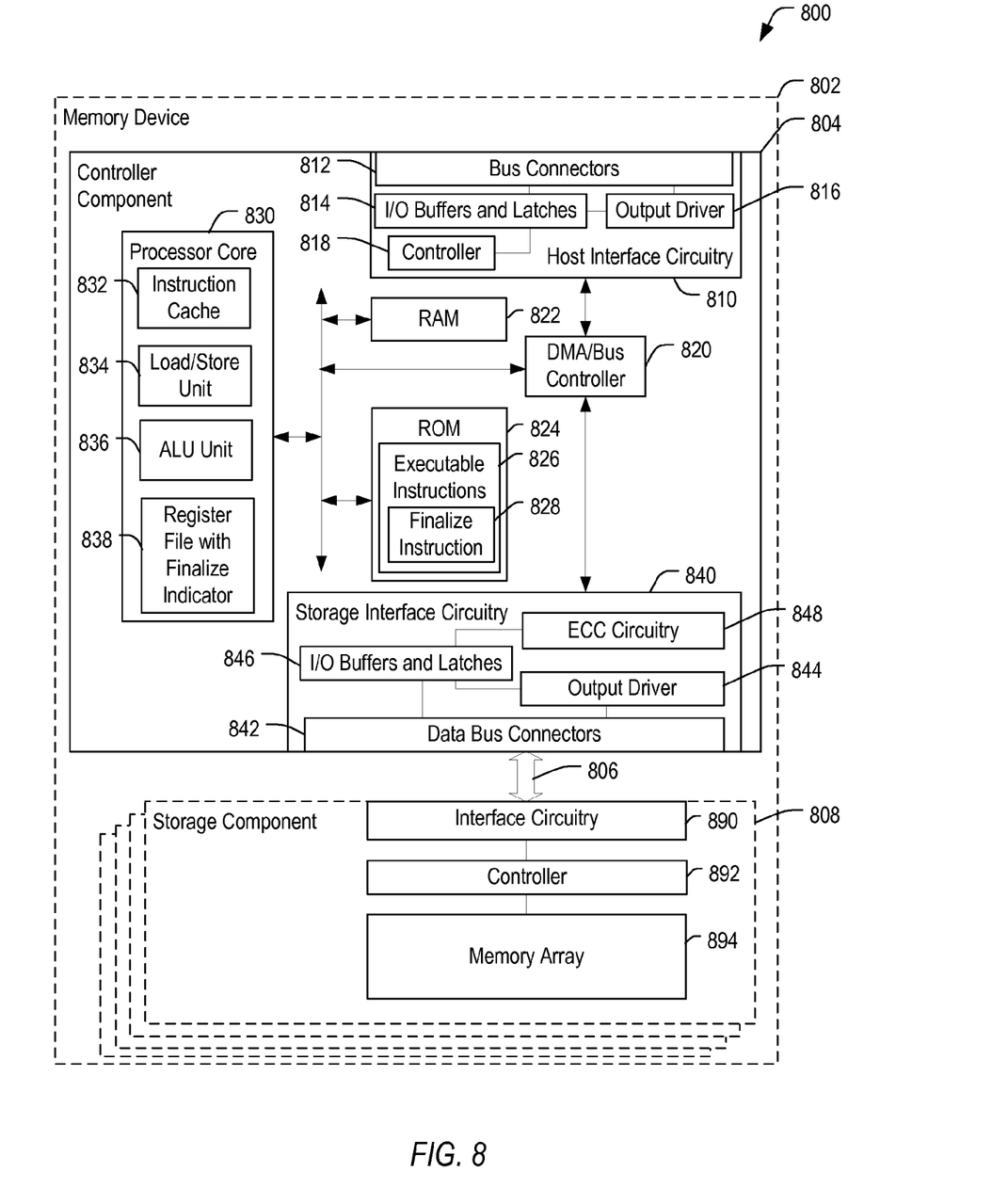
FIG. 8 is a block diagram of a second illustrative system that can be used to finalize a semiconductor memory.

In a particular embodiment, the controller component 804 includes host interface circuitry 810 coupled to a direct memory access (DMA)/bus controller 820. The controller component 804 also includes storage interface circuitry 840 that is coupled to the DMA/bus controller 820. A processor core 830, a random access memory (RAM) 822 and a read-only memory (ROM) 824 are coupled to the DMA/bus controller 820 via an internal bus.

In a particular embodiment, the host interface circuitry 810 includes bus connectors 812 coupled to input/output (I/O) buffers and latches 814. The bus connectors 812 are further coupled to output driver circuitry 816. The host interface circuitry 810 also includes a controller 818. In a particular embodiment, the host interface circuitry 810 operates in accordance with a universal serial bus (USB) protocol. For example, the controller 818 may be programmed to receive USB protocol instructions and data from a host device (not shown) via the bus connectors 812 that are coupled to a universal serial bus. The controller 818 may include a hardware processor that executes instructions stored at an internal memory, such as a read-only memory (not shown) to enable receipt and acknowledgment of USB instructions and data. Alternatively, or in addition, the host interface circuitry 810 may be configured to support other communication protocols, such as a Secure Digital (SD) protocol, a small computer system interface (SCSI), parallel interface (SPI), a Compact Flash (CF) protocol, one or more other protocols, or any combination thereof.

In a particular embodiment, the processor core 830 includes an instruction cache 832, a load/store unit 834, an arithmetic logic unit (ALU) unit 826, and a register file 838 that may store a finalize indicator. The processor core 830 may include, or may function substantially similarly to, an ARM core, as an illustrative, non-limiting example. For example, the processor core 830 may support a reduced instruction set computer (RISC) micro-architecture. The processor core 830 may be configured to retrieve data and executable instructions 826 via the load/store unit 834 from the read only memory 824. The executable instructions 826 may include a finalize instruction 828 that may be configured to finalize a semiconductor memory, such as a memory array 894 at the storage component 808.

Alternatively, or in addition, at least some of the executable instructions 826, including the finalize instruction 828, may not be stored at the ROM 824 and may instead be stored at the memory array 894. The executable instructions including the finalize instruction 828 may be retrieved from the memory array 894 and stored at the RAM 822. The processor core 830 may be configured to retrieve the executable instructions including the finalize instruction 828 from the RAM 822 for execution.

The executable instructions 826, such as the finalize instruction 828, may be retrieved by the load/store unit 834 and stored to the instruction cache 832. The finalize instruction 828 at the instruction cache 832 may be scheduled and provided to one or more execution pipelines, such as an execution pipeline including the ALU unit 836. The ALU unit 836 may include dedicated circuitry to perform arithmetic and logic operations, such as addition and subtraction, AND, NOT, OR, exclusive-OR (XOR), other arithmetic or logic operations, or any combination thereof.

The register file 838 may include multiple memory cells that may provide high speed access to the processor core 830 of data to be used for execution of instructions. One or more memory cells at the register file 838 may be dedicated to store a status indicator, such as the finalize status indicator. The finalize instruction 828 may be executed at an execution pipeline that may result in the finalize indicator of the register file 838 to be set to a finalize value. Additional data values, such as values to indicate memory type, memory write status, and write protect status, may also be set during execution of the finalize instruction 828 at the processor core 830.

Thus, in a particular embodiment, the processor core 830 may be programmed to perform at least a portion of the method 600 of FIG. 6. For example, the processor core 830 may be programmed to receive an indication that a finalize command has been received via the host interface circuitry 810. The processor core may also be programmed to control a register write circuit (not shown) to write a value, such as one or more predetermined bit values or byte values, to the register file 838 at a location associated with the finalize indicator to indicate the finalize status. The processor core 830 may also be programmed to cause one or more other indicators to be updated in response to receiving the finalize command, such as a memory type indicator, a write protect indicator, a commands supported indicator, one or more other indicators, or any combination thereof. For example, the one or more other indicators may be stored at one or more registers (not shown) of the host interface circuitry 810 and may be written by the controller 818 in response to a register write instruction from the processor core 830. The processor core 830 may further be programmed to retrieve data indicating a number of data writes of at least a portion of the memory array 894 and to determine a number of memory erase and rewrite cycles to perform at the memory array 894 to improve data retention at the memory array 894.

The storage interface circuitry 840 may include data bus connectors 842, an output driver 844, input/output buffers and latches 846, and error correcting code (ECC) circuitry 848. The data bus connectors 842 may include electrical connectors to enable electrical signal propagation via the bus 806. The I/O buffers and latches 846 may be configured to store data that is received via the DMA/bus controller 820 to be transmitted via the bus 806 using electrical signals at the data bus connectors 842 that are generated by the output driver 844. In addition, or alternatively, the I/O buffers and latches 846 may store data values represented by electrical signals received at the data bus connectors 842 via the data bus 806, such as signals generated by the interface circuitry 890 of the storage component 808.

The ECC circuitry 848 may include dedicated hardware and circuitry configured to perform operations using data and error correcting code information corresponding to the data that are received as a result of a memory read from the storage component 808, and may perform logical or arithmetic operations to verify that the received data is not detected to have corrupted values. For example, the received data may include additional bits representing an error correcting code, which may be encoded based on values of the data upon storage at the memory array 894. Corruption of one or more bits of the data, or one or more bits of the error correcting code, may be detectable by the ECC circuitry 848. For example, the storage interface circuitry 840 may include a flash memory interface, and the ECC circuitry 848 may be compliant with one or more flash error correcting code protocols.

Although various components depicted herein are illustrated as block components and described in general terms, such components may include one or more microprocessors, state machines, or other circuits configured to enable the disclosed data storage devices, such as the data storage device 104 of FIG. 1, to perform the particular functions attributed to such components. For example, the host interface 110, the controller 120, or both, of FIG. 1, may represent physical components, such as controllers, state machines, logic circuits, or other structures to enable the data storage device 104 to receive and respond to data requests from a host device or from other external devices to finalize a semiconductor memory of the data storage device 104.

For example, the controller 120 of FIG. 1 may be implemented using a microprocessor or microcontroller programmed to respond to the finalize instruction 103 by writing a finalize value to the status indicator 128 and to prevent subsequent data write or erase instructions from being performed at the semiconductor memory 130. In a particular embodiment, the controller 120 of FIG. 1 includes executable instructions that are executed by a processor and the instructions may be stored at the semiconductor memory 130. Alternatively, or in addition, executable instructions that are executed by the processor may be stored at a separate memory location that is not part of the semiconductor memory 150, such as at a read-only memory (ROM) (not shown) at the controller 120.

In a particular embodiment, the data storage device 104 may be a portable device configured to be selectively coupled to one or more external devices. However, in other embodiments, the data storage device may be attached or embedded within one or more host devices, such as within a housing of a portable communication device. For example, the data storage device may be within a packaged apparatus such as a wireless telephone, personal digital assistant (PDA), gaming device or console, portable navigation device, or other device that uses internal non-volatile memory. In a particular embodiment, the data storage device 104 includes a non-volatile memory, such as a flash memory (e.g., NAND, NOR, Multi-Level Cell (MLC), Divided bit-line NOR (DINOR), AND, high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description. Accordingly, the disclosure and the figures are to be regarded as illustrative rather than restrictive.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
  receiving an instruction to finalize data stored in a data storage device, the data storage device including a controller coupled to a semiconductor memory, the semiconductor memory storing the data and having a write protect pin and a memory type indicator associated therewith that indicates that the semiconductor memory is a re-writable memory;
  using the controller to emulate an assertion of the write protect pin after receiving the instruction to finalize the data;
  changing the memory type indicator associated with the semiconductor memory to a read-only memory type indicator to finalize the data and to cause the data to be write-protected; and
  subsequent to the changing of the memory type indicator, performing at least one cycle of erasing and rewriting the data in the semiconductor memory.

2. The method of claim 1, further comprising determining whether rewriting the data in the semiconductor memory would enhance data retention in the data storage device.

3. The method of claim 1, further comprising setting a status indicator to a value indicating that the data is finalized, the value being stored in a persistent memory cell of the data storage device.

4. The method of claim 3, wherein the persistent memory cell is located at the controller.

5. The method of claim 3, wherein the persistent memory cell is located at the semiconductor memory.

6. The method of claim 1, wherein the controller and the semiconductor memory are integrated in a single semiconductor device.

7. The method of claim 1, wherein the controller is formed on a controller component and the semiconductor memory is formed on a storage component.

8. The method of claim 1, further comprising after the data is finalized providing status information to a host, the status information indicating that the semiconductor memory is a read-only memory to prevent the host from issuing commands to the data storage device that would change the data.

9. The method of claim 1, further comprising after the data is finalized providing status information to a host, the status information indicating that data write operations are not supported.

10. The method of claim 1, further comprising after the data is finalized providing status information to a host, the status information indicating that the semiconductor memory is write-protected to prevent the host from issuing commands to the data storage device that would change the data.

11. The method of claim 1, further comprising, in response to receiving a query from a host device, reading the memory type indicator and generating at least one of a value that indicates whether data write operations are supported and a value that indicates whether the semiconductor memory is write-protected, based on the memory type indicator.

12. An apparatus comprising:
  a memory controller; and
  a storage interface circuit coupled to the memory controller,
  wherein the memory controller is configured:
    to finalize data in a semiconductor memory that is coupled to the memory controller via the storage interface circuit, the semiconductor memory having a write protect pin and an associated indicator, the associated indicator indicating that the semiconductor memory is a re-writeable memory;
    in response to receiving an instruction from a host to finalize the data in the semiconductor memory, to change the associated indicator to indicate that the semiconductor memory is a read-only memory to finalize the data by causing the data to be write-protected and to emulate an assertion of the write protect pin after receiving the instruction to finalize the data, wherein subsequent to changing the associated indicator, the memory controller is further configured to perform at least one cycle of erasing and rewriting the data in the semiconductor memory.

13. The apparatus of claim 12, wherein a status indicator is persistently set to a value indicating that the data is finalized in response to finalizing the data.

14. The apparatus of claim 13, wherein the memory controller includes a one-time programmable memory cell that stores at least a portion of the status indicator as a logical value.

15. The apparatus of claim 13, wherein the semiconductor memory includes a one-time programmable memory cell that stores at least a portion of the status indicator as a logical value.

16. The apparatus of claim 13, wherein the memory controller includes a status register configured to store at least one bit of the status indicator.

17. The apparatus of claim 13, wherein the semiconductor memory includes a flash memory cell and wherein at least one bit of the status indicator is stored in the flash memory cell.

18. The apparatus of claim 12, wherein the memory controller is further configured to, in response to receiving the instruction from the host, determine whether performing the at least one cycle of erasing and rewriting the data would enhance data retention in the semiconductor memory.

19. The apparatus of claim 12, wherein the memory controller is further configured to, in response to receiving the instruction from the host, send a value to the host that indicates that the semiconductor memory is associated with a read-only indicator.

20. The apparatus of claim 12, wherein the memory controller, the storage interface circuit, and the semiconductor memory are integrated in a single semiconductor device.

21. The apparatus of claim 12, wherein the memory controller is formed on a controller component and the semiconductor memory is formed on a storage component.

22. A data storage device comprising:
  a memory controller;
  a semiconductor memory responsive to the memory controller and having a write protect pin; and an interface circuit configured to couple to a host system, wherein the memory controller is configured to:

configure the semiconductor memory to be an archival media device by causing data stored therein to be write-protected, wherein causing the data to be write-protected includes:

setting a status indicator to a finalize value to finalize the data in the semiconductor memory in response to receiving an instruction via the interface circuit to finalize the data, wherein the memory controller is further configured to emulate an assertion of the write protect pin after receiving the instruction to finalize the data; and subsequent to emulating the assertion, performing at least one cycle of erasing and rewriting the data in the semiconductor memory; and in response to finalizing the data, cause the host system to logically disconnect from the semiconductor memory and to logically reconnect to the semiconductor memory for a status update, wherein the status update includes an indication that the data is finalized.

23. The data storage device of claim 22, wherein the indication that the data is finalized includes an indication that the semiconductor memory does not support data write operations.

24. The data storage device of claim 22, wherein the indication that the data is finalized includes an indication that the semiconductor memory is write-protected.

25. The data storage device of claim 22, wherein finalizing the data includes changing a type of the semiconductor memory from a re-writeable memory type to a read-only memory type.

26. The data storage device of claim 25, wherein causing the data to be write-protected further includes determining whether performing the at least one cycle of erasing and rewriting the data in the semiconductor memory would enhance retention of the data in the data storage device.

27. A method comprising:

receiving an instruction to finalize data stored in a data storage device;

emulating an assertion of a write protect pin of the data storage device; and subsequent to the emulating of the assertion, performing at least one cycle of erasing and rewriting the data in the data storage device.

28. The method of claim 27, further comprising configuring the data storage device to prevent the data from being changeable to finalize the data in the data storage device in response to receiving the instruction.

29. The method of claim 28, wherein finalizing the data includes setting a commands supported indicator to a value indicating that write operations are not supported.

30. The method of claim 28, wherein finalizing the data includes setting a write protect indicator to a value indicating that the data is write-protected.

31. The method of claim 28, wherein the data storage device includes a semiconductor memory configured to store the data therein and wherein the at least one cycle of erasing and rewriting the data is performed in the semiconductor memory to enhance retention of the data in the data storage device.

32. The method of claim 27, further comprising sending status information to a host system to indicate that the data is finalized.

33. The data storage device of claim 22, wherein prior to receiving the instruction, the memory controller is further configured to track a number of data writes to memory cells of the semiconductor memory.

34. The data storage device of claim 33, wherein the memory controller is further configured to use the number to determine whether the at least one cycle of erasing and rewriting the data in the semiconductor memory would enhance data retention in the semiconductor memory.

35. The data storage device of claim 22, wherein the memory controller is further configured to correct data errors in the semiconductor memory.

36. The data storage device of claim 22, wherein the status indicator is a value stored in a persistent memory cell of the semiconductor memory.

37. The data storage device of claim 22, wherein the semiconductor memory includes a persistent memory cell.

38. The data storage device of claim 37, wherein the persistent memory cell is a one-time-programmable (OTP) memory cell.

* * * * *